(12) United States Patent
Yun et al.

(10) Patent No.: US 9,373,651 B2
(45) Date of Patent: Jun. 21, 2016

(54) DISPLAY DEVICE AND METHOD OF MANUFACTURING THE SAME

(71) Applicant: Samsung Display Co., Ltd., Yongin (KR)

(72) Inventors: Sung-Jae Yun, Yongin-si (KR); Hae-Young Yun, Suwon-si (KR); Hyeok-Jin Lee, Seongnam-si (KR); Hong-Jo Park, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 147 days.

(21) Appl. No.: 14/164,958

(22) Filed: Jan. 27, 2014

(65) Prior Publication Data

US 2014/0141554 A1 May 22, 2014

Related U.S. Application Data

(62) Division of application No. 12/259,673, filed on Oct. 28, 2008, now abandoned.

(30) Foreign Application Priority Data

Feb. 21, 2008 (KR) ........................ 10-2008-0015963

(51) Int. Cl.
*G02F 1/1343* (2006.01)
*H01L 27/12* (2006.01)
*G02F 1/1337* (2006.01)
(Continued)

(52) U.S. Cl.
CPC .......... *H01L 27/1259* (2013.01); *G02F 1/1368* (2013.01); *G02F 1/133707* (2013.01); *G02F 2001/13793* (2013.01)

(58) Field of Classification Search
CPC .......... G02F 1/133707; G02F 27/1259; G02F 1/1368; G02F 2001/13793
USPC .................................................. 349/141–144
See application file for complete search history.

(56) References Cited

U.S. PATENT DOCUMENTS

| | | | |
|---|---|---|---|
| 5,694,188 A | 12/1997 | Sano et al. | |
| 5,796,121 A * | 8/1998 | Gates | 257/59 |
| 5,886,762 A | 3/1999 | Lee et al. | |

(Continued)

FOREIGN PATENT DOCUMENTS

| | | |
|---|---|---|
| JP | 2005-316013 | 12/2002 |
| JP | 2005-157164 | 6/2005 |

(Continued)

OTHER PUBLICATIONS

Non-Final Office Action issued on Nov. 14, 2011 in U.S. Appl. No. 12/259,673.

(Continued)

*Primary Examiner* — Hoan C Nguyen
(74) *Attorney, Agent, or Firm* — H.C. Park & Associates, PLC

(57) ABSTRACT

A display device includes a first substrate including a protrusion electrode pattern, a second substrate disposed opposite to the first substrate, and a liquid crystal layer disposed between the first substrate and the second substrate. The protrusion electrode pattern is made of a conductive polymer material, and a state of the liquid crystal layer changes from an isotropic state to an anisotropic state when an electric field is applied.

8 Claims, 7 Drawing Sheets

(51) Int. Cl.
 *G02F 1/1368* (2006.01)
 *G02F 1/137* (2006.01)

(56) References Cited

U.S. PATENT DOCUMENTS

| | | | |
|---|---|---|---|
| 6,277,510 B1 | 8/2001 | Chang et al. | |
| 6,340,496 B1 | 1/2002 | Cloots et al. | |
| 6,480,252 B1 | 11/2002 | Lee et al. | |
| 7,436,465 B2 | 10/2008 | Moriya et al. | |
| 7,571,529 B2 * | 8/2009 | Sirringhaus et al. | 29/417 |
| 2002/0025391 A1 * | 2/2002 | Angelopoulos et al. | 428/1.4 |
| 2002/0113920 A1 | 8/2002 | Kubota et al. | |
| 2003/0076456 A1 * | 4/2003 | Lee et al. | 349/106 |
| 2004/0028875 A1 * | 2/2004 | Van Rijn et al. | 428/98 |
| 2004/0196425 A1 | 10/2004 | Hsieh et al. | |
| 2005/0037693 A1 | 2/2005 | Uchikura et al. | |
| 2005/0179847 A1 | 8/2005 | Miyachi et al. | |
| 2006/0003568 A1 * | 1/2006 | Choi et al. | 438/610 |
| 2006/0170846 A1 | 8/2006 | Ozawa | |
| 2007/0080370 A1 | 4/2007 | Miyachi et al. | |
| 2008/0088759 A1 | 4/2008 | Utsumi et al. | |
| 2008/0143906 A1 | 6/2008 | Allemand et al. | |
| 2008/0199634 A1 | 8/2008 | Nakamura | |
| 2010/0067211 A1 | 3/2010 | Han et al. | |

FOREIGN PATENT DOCUMENTS

| | | |
|---|---|---|
| JP | 2005-189434 | 7/2005 |
| JP | 2005-227760 | 8/2005 |
| JP | 2005-308825 | 11/2005 |
| JP | 2005-316011 | 11/2005 |
| KR | 10-2002-0095505 | 12/2002 |
| KR | 10-2005-0072472 | 7/2005 |
| KR | 10-2005-0086567 | 8/2005 |
| KR | 10-2006-0072774 | 6/2006 |
| KR | 10-2006-0121404 | 11/2006 |
| KR | 10-2007-0066636 | 6/2007 |
| KR | 10-2007-0073712 | 7/2007 |

OTHER PUBLICATIONS

Final Office Action issued on Feb. 24, 2012 in U.S. Appl. No. 12/259,673.
Non-Final Office Action issued on Oct. 12, 2012 in U.S. Appl. No. 12/259,673.
Final Office Action issued on Apr. 8, 2013 in U.S. Appl. No. 12/259,673.
Non-Final Office Action issued on Oct. 30, 2013 in U.S. Appl. No. 12/259,673.

* cited by examiner

Absence state of electric field
blue phase and non-birefringence

Application state of electric field
birefringence

DISPLAY DEVICE AND METHOD OF MANUFACTURING THE SAME

CROSS-REFERENCE TO RELATED APPLICATIONS

This application is a divisional of U.S. patent application Ser. No. 12/259,673, filed on Oct. 28, 2008, and claims priority from and the benefit of Korean Patent Application No. 10-2008-0015963, filed on Feb. 21, 2008, all of which are hereby incorporated by reference for all purposes as if fully set forth herein.

BACKGROUND OF THE INVENTION

1. Field of the Invention

The present invention relates to a display device.

2. Discussion of the Background

Several kinds of display devices exist. Due to rapid development of semiconductor technology, liquid crystal displays (LCDs) having improved performance and decreased size and weight have been developed.

In an LCD, light transmittance is determined by an alignment state of a liquid crystal layer. Because light transmittance is adjusted by physical movement of the liquid crystal layer, the LCD may have a problem in terms of response speed.

Blue phase liquid crystal that has a relatively fast response speed of about 3 μm has been developed. Because blue phase liquid crystal has a very narrow operating temperature range, a crystal structure thereof may be stabilized by adding a monomer and polymerizing.

When an electric field does not exist, blue phase liquid crystal has optical isotropy, exhibits a blue phase, and does not have birefringence. In this state, if an electric field is applied to the blue phase liquid crystal, it has optical anisotropy and birefringence. In this case, an electric field that is applied to the blue phase liquid crystal is applied in a substantially horizontal direction. Here, the horizontal direction indicates a direction parallel to a pair of substrates that are disposed opposite to each other with blue phase liquid crystal disposed therebetween. An electric field is applied to the blue phase liquid crystal through an electrode in the substrate.

However, a display device using blue phase liquid crystal may have a relatively high driving voltage and deteriorated light transmittance.

Accordingly, by protruding an electrode from a substrate in a direction perpendicular to the substrate, a strong horizontal electric field, which is applied to the blue phase liquid crystal, may be formed, whereby the driving voltage may be lowered.

However, it may be difficult to stably protrude an electrode. Specifically, it may be difficult to accurately align the electrode when forming the protruded electrode. If the electrode is not properly aligned, the horizontal electric field may be weak, and therefore, the driving voltage may not decrease even when the protruded electrode is used.

SUMMARY OF THE INVENTION

The present invention provides a display device having a deceased driving voltage.

The present invention also provides a method of manufacturing the display device.

Additional features of the invention will be set forth in the description which follows, and in part will be apparent from the description, or may be learned by practice of the invention.

The present invention discloses a display device including a first substrate including a protrusion electrode pattern, a second substrate disposed opposite to the first substrate, and a liquid crystal layer disposed between the first substrate and the second substrate. The protrusion electrode pattern is made of a conductive polymer material, and a state of the liquid crystal layer changes from an isotropic state to an anisotropic state when an electric field is applied.

The present invention also discloses a method of manufacturing a display device, including forming a thin film transistor on a substrate, coating a conductive polymer layer on the substrate and the thin film transistor, and forming a protrusion electrode pattern that is connected to the thin film transistor by imprinting the conductive polymer layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
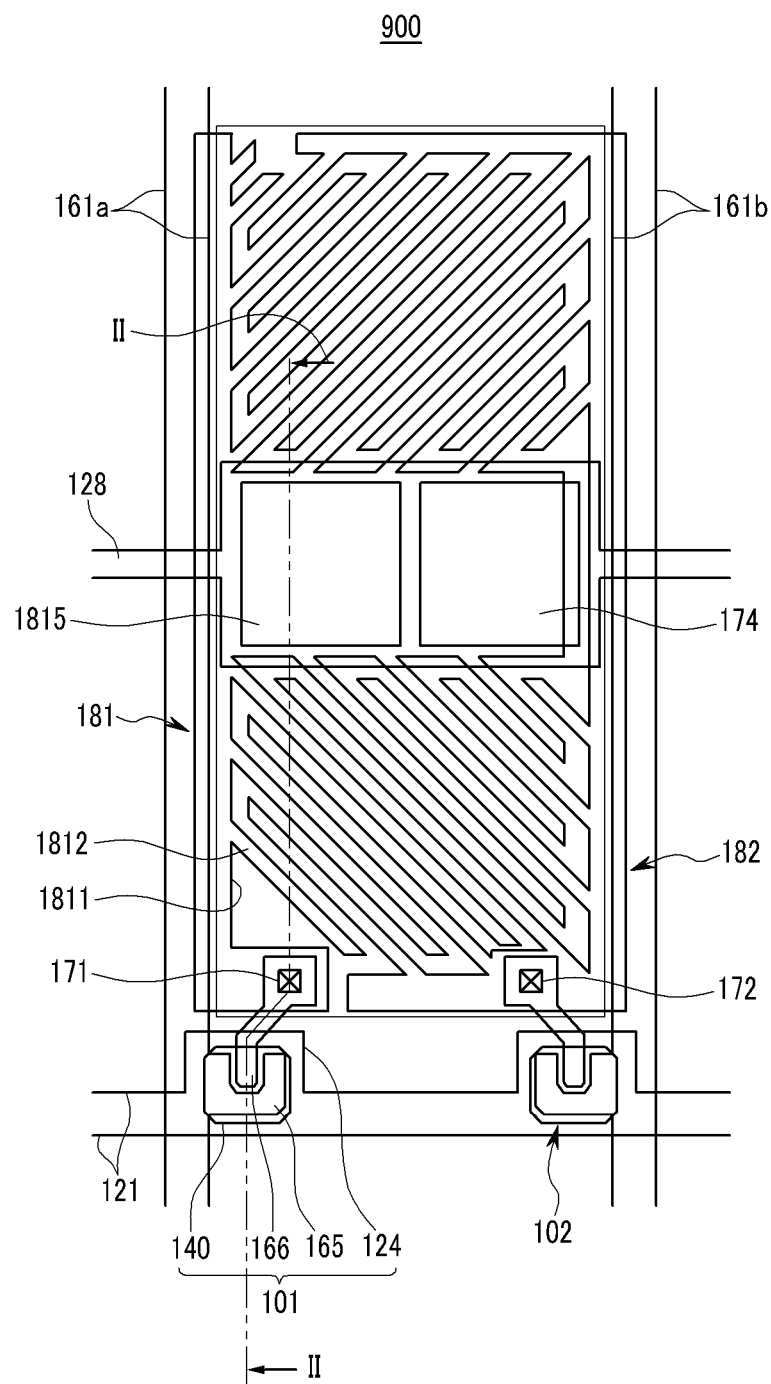
FIG. 1 is a layout view of a display device according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements, It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

In an exemplary embodiment, a display device may include an amorphous silicon (a-Si) thin film transistor (TFT) that is formed in a process using five masks. Further, two TFTs may be used in one pixel. A pixel is a minimum unit for displaying an image. However, in exemplary embodiments of the present invention, a TFT may be embodied in various forms and is not limited to the example that is described herein.

An exemplary embodiment of the present invention is described with reference to FIG. 1 and FIG. 2. FIG. 1 is a layout view of a display device 900 according to an exemplary embodiment of the present invention, and FIG. 2 is a cross-sectional view of the display device taken along line II-II of FIG. 1.

Figure 2:
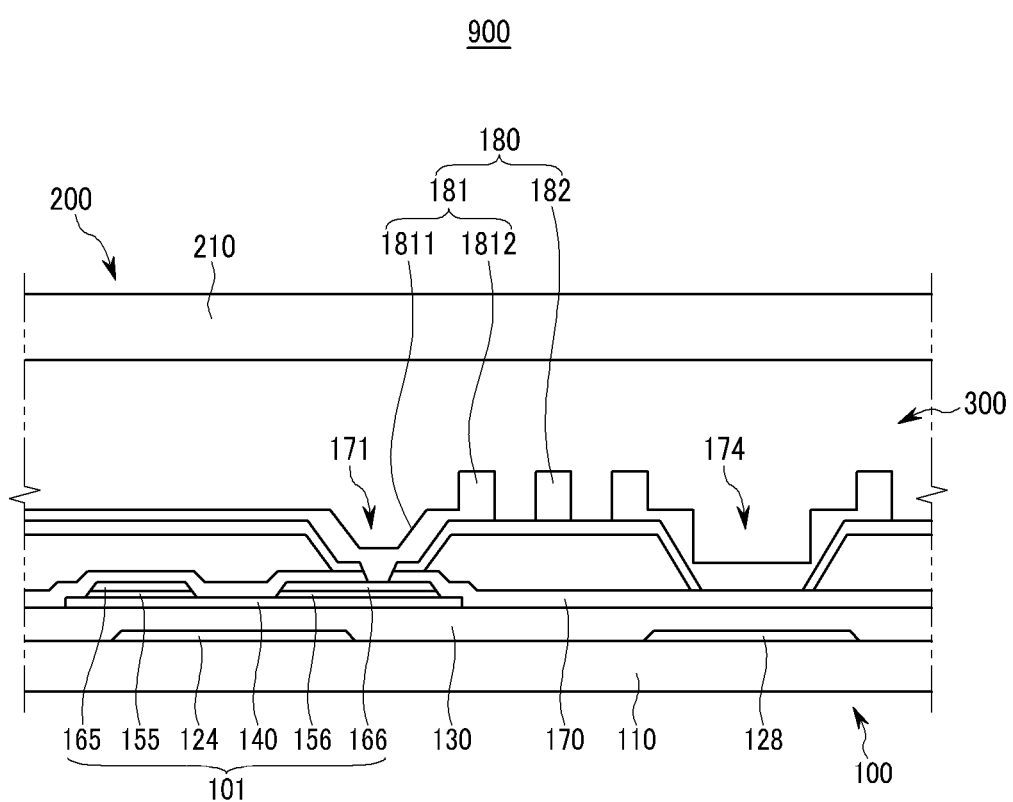
FIG. 2 is a cross-sectional view of the display device taken along line II-II of FIG. 1.

As shown in FIG. 1 and FIG. 2, the display device 900 includes a first substrate 100, a second substrate 200, and a liquid crystal layer 300.

The first substrate 100 includes a first substrate member 110 and a protrusion electrode pattern 180 disposed on the first substrate member 110.

The protrusion electrode pattern 180 includes a first protrusion electrode 181 and a second protrusion electrode 182 that are disposed apart from each other. The first protrusion electrode 181 and the second protrusion electrode 182 are formed in slit patterns so that they are alternately engaged with each other.

The first protrusion electrode 181 and the second protrusion electrode 182 protrude toward the liquid crystal layer 300 in a direction perpendicular to the first substrate member 110. Therefore, a horizontal electric field may be effectively formed between the first protrusion electrode 181 and the second protrusion electrode 182. Here, the horizontal electric field indicates a direction that is substantially parallel to the first substrate 100 and the second substrate 200 that are disposed opposite each other with the liquid crystal layer 300 disposed therebetween. This is because the first electrode 181 and the second electrode 182 each have a three-dimensional shape.

The width of each protrusion electrode pattern 180, i.e., the first protrusion electrode 181 and the second protrusion electrode 182, and a distance between the protrusion electrodes 181 and 182 is small, which may improve the performance of the display device 900. Further, as the height of the protrusion electrode pattern 180 increases, the driving voltage decreases, but a minimum distance should be maintained between the first substrate 100 and the second substrate 200 to obtain an appropriate transmittance of light.

In consideration of the above-described condition and an actual margin in a manufacturing process, each of the first protrusion electrode 181 and the second protrusion electrode 182 of the protrusion electrode pattern 180 may have a width in the range of 1 μm to 10 μm and the first protrusion electrode 181 and the second protrusion electrode 182 may be disposed at a distance in the range of 1 μm to 10 μm apart. Further, the protrusion electrode pattern 180 may have a height in the range of 1 μm to 6 μm.

In addition, if a distance between the first protrusion electrode 181 and the second protrusion electrode 182 is greater than the width of each of the first protrusion electrode 181 and the second protrusion electrode 182, light transmittance may be improved, and if a distance between the first protrusion electrode 181 and the second protrusion electrode 182 is smaller than the width of each of the first protrusion electrode 181 and the second protrusion electrode 182, the driving voltage may be decreased. Because a display device 900 that uses blue phase liquid crystal may have a relatively high driving voltage, it may be more advantageous to decrease the driving voltage. Therefore, the width of each of the first electrode 191 and the second electrode 192 may be greater than or equal to a distance between the first electrode 181 and the second electrode 182. However, the present invention is not limited thereto. Therefore, when attempting to increase light transmittance, rather than decrease the driving voltage, the width of each of the first protrusion electrode 181 and the second protrusion electrode 182 may be less than a distance between the first protrusion electrode 181 and the second protrusion electrode 182.

Further, in FIG. 2, a cross-section of the first protrusion electrode 181 and the second protrusion electrode 182 may have a quadrangular shape, but the present invention is not limited thereto. Therefore, a cross-section of the first protrusion electrode 181 and the second protrusion electrode 182 may be a polygonal shape, a semicircular shape, or a semi-oval shape instead of a quadrangular shape.

Further, the protrusion electrode pattern 180 may be made of a conductive polymer material. The conductive polymer material may be made by mixing a conductive particle with an insulating or semiconducting polymer, or by chemically processing an insulating or semiconducting polymer.

Hereinafter, the conductive polymer material that is made by mixing a conductive particle with an insulating or semiconducting polymer is referred to as a mixed conductive polymer material.

The mixed conductive polymer material indicates a polymer material having conductivity due to conductive particles that are mixed with the insulating or semiconducting polymer.

The mixed conductive polymer material is made by mixing conductive particles with a thermoplastic polymer material. In this case, particles, such as metal powder particles, carbon nanotubes (CNT), and/or carbon nanofiber (CNF), may be used as the conductive particles.

The mixed conductive polymer material may include a highly conductive polyethylene-dioxythiophene (PEDOT).

Hereinafter, a conductive polymer material that is made by chemically processing an insulating or semiconducting polymer is referred to as a pure conductive polymer material.

The pure conductive polymer material indicates a polymer material that has conductivity due to chemical processing of an insulating or semiconducting polymer.

The pure conductive polymer material may include polyacetylene that is processed with iodine. By processing polyacetylene having a semiconducting property with iodine, the polyacetylene has electrical conductivity similar to that of a metal.

The pure conductive polymer material may include polyaniline, polypyrrole, polythiophene, poly(p-phenylene), poly (p-phenylene vinylene), poly(3,4-ethylenedioxythiophene) (PEDOT), or poly(thienylene vinylene).

Such conductive polymer materials may have electrical conductivity in a range of $10^{-16}$ S/cm to $10^5$ S/cm.

Further, the first substrate 100 further includes TFTs 101 and 102, a gate line 121, and data lines 161a and 161b that are disposed on the first substrate member 110.

The TFT includes the first TFT 101 and the second TFT 102. The first TFT 101 is connected to the first protrusion electrode 181, and the second TFT 102 is connected to the second protrusion electrode 182. The first TFT 101 and the second TFT 102 are connected to the same gate line 121 and to different data lines 161a and 161b. Accordingly, different voltages are applied to the first protrusion electrode 181 and the second protrusion electrode 182, and a horizontal electric field is generated between the first protrusion electrode 181 and the second protrusion electrode 182. The horizontal electric field is an electric field that is generated in a direction substantially parallel to the substrates 100 and 200. Liquid crystal of the liquid crystal layer 300 is moved by the horizontal electric field generated between the first protrusion electrode 181 and the second protrusion electrode 182.

Further, the first substrate 100 also includes a color filter 175. The color filter 175 is disposed between the first substrate member 110 and the protrusion electrode pattern 180. The color filter 175 gives a color to light passing through the liquid crystal layer 300.

The second substrate 200 includes a second substrate member 210 and is disposed opposite the first substrate 100.

The liquid crystal layer 300 includes crosslinked blue phase liquid crystal and is disposed between the first substrate 100 and the second substrate 200. The blue phase liquid crystal of the liquid crystal layer 300 moves according to a horizontal electric field generated between the first protrusion electrode 181 and the second protrusion electrode 182. Because an operating temperature range of the blue phase liquid crystal is small, the blue phase liquid crystal is polymerized by adding a non-liquid crystalline monomer to low molecule liquid crystal that can exhibit a blue phase and applying ultraviolet rays to the monomer. Thereby, crosslinked blue phase liquid crystal having a stabilized crystal structure is manufactured. The crosslinked blue phase liquid crystal has a form in which a net shape structure of a polymer is formed in a low molecule liquid crystal. That is, the blue phase liquid crystal is stabilized for a large temperature range by curing a monomer that is added to chiral nematic liquid crystal in a polymer. The blue phase is one of liquid crystal phases that appear in several temperature ranges between a cholesteric phase and an isotropic phase.

When using the liquid crystal layer 300 including the blue phase liquid crystal, it may be unnecessary to form an alignment layer on the first substrate 100 and the second substrate 200. When an electric field does not exist, the blue phase liquid crystal has optical isotropy, exhibits a blue phase, and does not have birefringence. In this state, if an electric field is applied to the blue phase liquid crystal, the blue phase liquid crystal may have optical anisotropy and birefringence. As the intensity of an electric field increases, the number of directors that are arranged in the direction of the electric field increases, so the blue phase liquid crystal has refractive anisotropy and thus its input polarization state changes. That is, transmittance may be adjusted when the alignment of the blue liquid crystal of the liquid crystal layer 300 changes according to a horizontal electric field (transverse electric field) that is formed between the first protrusion electrode 181 and the second protrusion electrode 182.

Further, when an electric field does not exist, because the blue phase liquid crystal has optical isotropy, the display device 900 drives in a normally black mode. That is, the display device 900 displays black when a voltage is not applied to the electrodes 181 and 182.

A non-liquid crystalline monomer is a material that is polymerized by heat or ultraviolet rays. As the non-liquid crystalline monomer, an acrylate-based monomer may be used, but the non-liquid crystalline monomer is not limited thereto. As the non-liquid crystalline monomer, a monomer including a polymerization radical such as a vinyl radical, an acryloyl radical, or a fumarate radical may be used. An initiator that can initiate polymerization of a cross-linker and a monomer may be used, as needed. As an initiator, acetophenone, benzophenone, etc., may be used. Further, it may be possible to add a chiral dopant to exhibit a chiral nematic phase to the liquid crystal layer 300.

A material that can exhibit a blue phase between a cholesteric phase (chiral nematic phase) and an isotropic phase may be used as the low molecule liquid crystal. Such a low molecule liquid crystal may include a molecular structure such as biphenyl and cyclohexyl, and may include a material that has chirality or a material that can exhibit a cholesteric phase when a chiral dopant is added.

Figure 3:
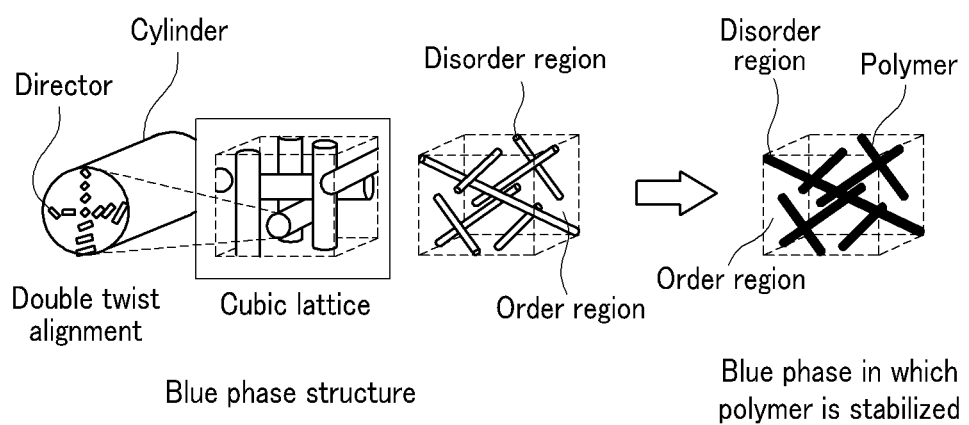
FIG. 3 is a diagram showing a process of stabilizing blue phase liquid crystal included in the display device of FIG. 1.
Figure 4:
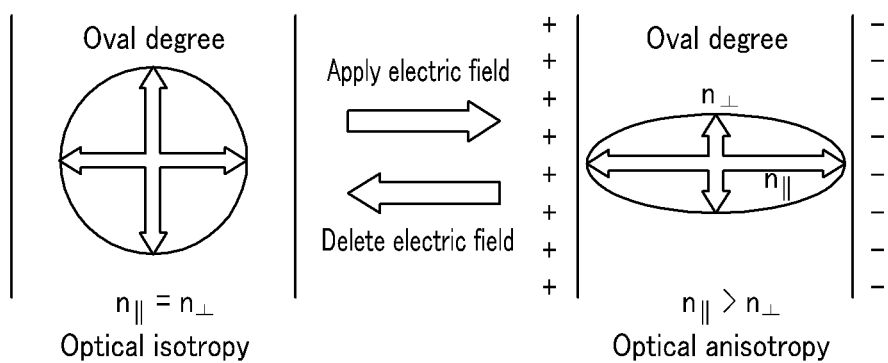
FIG. 4 is a diagram showing changing characteristics according to whether an electric field is applied to blue phase liquid crystal that is used for the display device of FIG. 1.
Figure 4:
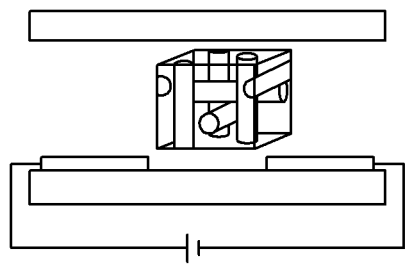
Figure 4:
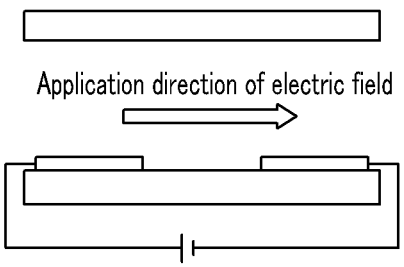

Referring to FIG. 3 and FIG. 4, the blue phase liquid crystal that is used for the display device 900 according to an exemplary embodiment of the present invention is additionally described.

As shown in FIG. 3, the blue phase liquid crystal may be made by forming a light curable polymer when deriving a chiral phase to positive liquid crystal and forming a blue phase at about 1 K (absolute temperature). Such blue phase liquid crystal is stable at temperatures up to room temperature.

Because a blue phase that is stabilized for a large temperature range by a polymer has a good equilibrium constant (K), a gray can be expressed by applying an electric field, and when an electric field does not exist, the blue phase has optical isotropy.

As shown in FIG. 4, when an electric field does not exist, blue phase liquid crystal has optical isotropy, exhibits a blue phase, and does not have birefringence. In this state, if an electric field is applied to the blue phase liquid crystal, the blue phase liquid crystal has optical isotropy and birefringence. In this case, an electric field that is applied to the blue phase liquid crystal is applied in a horizontal direction, i.e., a direction that crosses a direction in which light passes through the liquid crystal layer 300.

Further, the blue phase liquid crystal that is used for the display device according to an exemplary embodiment of the present invention may have a chiral pitch of 300 nm or less, for example, about 200 nm. This is because the chiral pitch of the blue phase liquid crystal should not overlap with a wavelength region of visible rays. Because the wavelength area of visible rays is in the range of about 350 nm to 650 nm, the blue phase liquid crystal should have a chiral pitch of 300 nm or less.

Further, the blue phase liquid crystal may have very high permittivity and refractive index, and has a nematic state.

Referring to FIG. 2, a structure of the display device 900 is described below in detail. FIG. 2 shows the first TFT 101. Hereinafter, a TFT actually indicates the first TFT 101, but the second TFT 102 has a structure that is substantially identical to that of the first TFT 101.

First, a structure of the first substrate 100 will be described. The first substrate member 110 may include a material such as glass, quartz, ceramic, or plastic, and is transparently formed.

A plurality of gate lines 121 (see FIG. 1), a plurality of gate electrodes 124 branched from the gate lines 121, and a plurality of storage electrode lines 128 are disposed on the first substrate member 110.

The gate wires 121, 124, and 128 may be made of a metal such as Al, Ag, Cr, Ti, Ta, Mo, and Cu, or alloys including the metal. In FIG. 2, although the gate wires 121, 124, and 128 are shown in a single layer, the gate wires 121, 124, and 128 may include multiple layers. The gate wires 121, 124, and 128 may include a metal layer of Cr, Mo, Ti, and/or Ta, which are excellent in physical and chemical characteristics, or alloys including the same, or an Al-based or Ag-based metal layer having low resistivity. The gate wires 121, 124, and 128 may be made of various metals or conductors, and may be made of a multilayer that can be patterned under the same etching conditions.

The gate insulating layer 130, which may be made of silicon nitride ($SiN_x$), is disposed on the gate wires 121, 124, and 128.

A data wire including a plurality of data lines 161*a* and 161*b* (see FIG. 1) crossing the gate line 121, a plurality of source electrodes 165 branched from the data lines 161*a* and 161b, and a plurality of drain electrodes 166 spaced apart from the source electrode 165 is disposed on the gate insulating layer 130.

Like the gate wires 121, 124, and 128, the data wires 161a, 161b, 165, and 166 may be made of a conductive material such as chromium, molybdenum, aluminum, copper, or alloys including the same, and may be a single layer or multiple layers.

A semiconductor layer 140 is disposed in a region including an upper part of a gate insulating layer 130 on the gate electrode 124 and a lower part of the source electrode 165 and the drain electrode 166. Specifically, at least a part of the semiconductor layer 140 overlaps with the gate electrode 124, the source electrode 165, and the drain electrode 166. The gate electrode 124, the source electrode 165, and the drain electrode 166 are three electrodes of the TFT 101. The semiconductor layer 140 between the source electrode 165 and the drain electrode 166 becomes a channel region of the TFT 101.

Further, ohmic contacts 155 and 156 to reduce contact resistance are disposed between the semiconductor layer 140 and each of the source electrode 165 and the drain electrode 166. The ohmic contacts 155 and 156 may be made of amorphous silicon in which silicide or an n-type impurity is doped in a high concentration.

A passivation layer 170, which may be made of an inorganic insulating material such as silicon nitride or silicon oxide, an organic insulating material, or a low dielectric constant insulating material such as a-Si:C:O and a-Si:O:F that is formed by plasma enhanced chemical vapor deposition (PECVD), may be disposed on the data wires 161a, 161b, 165, and 166.

Color filters 175 having three primary colors may be sequentially disposed on the passivation layer 170. In this case, colors of the color filters 175 are not limited to three primary colors and may variously be formed in at least one color. The color filters 175 give a color to light that passes through the display device 900.

The color filter 175 is disposed on the passivation layer 170, but the present invention is not always limited thereto. Therefore, the color filter 175 may be formed between the passivation layer 170 and the data wires 161a, 161b, 165, and 166. Further, the color filter 175 may be disposed on the second substrate 200 rather than the first substrate 100.

Further, a light blocking member 176 is disposed on a portion of the passivation layer 170 corresponding to the TFT 101 and on which the color filter 175 is not disposed. The light blocking member 176 suppresses an operation error of the TFT 101 due to generation of a light leakage current when light enters a channel region of the TFT 101. The light blocking member 176 is not always necessary and may be omitted as needed.

A capping layer 179 is disposed on the color filter 175 and the light blocking member 176. The capping layer 179 protects organic layers including the color filter 175. The capping layer 179 is not always necessary and may be omitted as needed. The capping layer 179 may be made of various materials, such as an inorganic layer including a material similar to that of the passivation layer 170.

A protrusion electrode pattern 180 is disposed on the capping layer 179. The protrusion electrode pattern 180 may be made of a conductive polymer material through an imprinting process.

The protrusion electrode pattern 180 includes a first protrusion electrode 181 and a second protrusion electrode 182. The first protrusion electrode 181 is connected to the first TFT 101, and the second protrusion electrode 182 is connected to the second TFT 102 (see FIG. 1). Specifically, the first protrusion electrode 181 and the second protrusion electrode 182 include a protruding electrode 1812 and a connection part 1811 that connects the protruding electrode 1812 and the TFT 101.

Further, a part 1815 of the protrusion electrode pattern 180 overlaps a first storage electrode line 128 of a gate wire to secure storage capacity.

Further, the passivation layer 170 and the capping layer 179 have a plurality of contact holes 171 and 172 that expose a portion of the drain electrode 166 of the first TFT 101 and the second TFT 102, respectively. In certain cases, the color filter 175 may also have contact holes 171 and 172 together with the passivation layer 170 and the capping layer 179. The first protrusion electrode 181 and the second protrusion electrode 182 are connected to the drain electrodes 166 of the first TFT 101 and the second TFT 102 through the contact holes 171 and 172, respectively. Further, the color filter 175 further includes an opening 174 formed on the first storage electrode line 128.

Blue phase liquid crystal of the liquid crystal layer 300 has an arrangement state that changes according to a horizontal electric field that is generated between the first protrusion electrode 181 and the second protrusion electrode 182, whereby light transmittance may be adjusted.

Next, the second substrate 200 includes a second substrate member 210 will be described.

Like the first substrate member 110, the second substrate member 210 may include a material such as glass, quartz, ceramic, or plastic, and is transparent.

However, in order to reduce the weight and thickness thereof, the second substrate member 210 may be made of plastic. The plastic may be polycarbonate, polyimide, polyethersulfone (PES), polyallylate (PAR), polyethylenenaphthalate (PEN), or polyethyleneterephthalte (PET), but is not limited thereto.

The display device 900 according to an exemplary embodiment of the present invention has a protrusion electrode that is accurately formed while having a simple structure, whereby the driving voltage thereof may be stably decreased.

A method of manufacturing a display device 900 according to an exemplary embodiment of the present invention is described hereinafter with reference to FIG. 5, FIG. 6, FIG. 7, FIG. 8, FIG. 9, FIG. 10, and FIG. 11.

Figure 5:
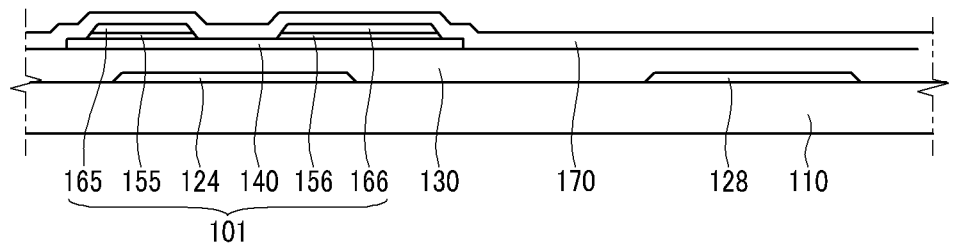
FIG. 5, FIG. 6, FIG. 7, FIG. 8, FIG. 9, and FIG. 10 are cross-sectional views sequentially showing a process of manufacturing the display device of FIG. 1.

First, as shown in FIG. 5, the TFT 101 including the gate electrode 124, the semiconductor layer 140, the ohmic contacts 155 and 156, the drain electrode 166, and the source electrode 165, and the passivation layer 170 that covers the TFT 101 are formed. A structure of the TFT 101 is not limited to the structure that is shown in the accompanying drawings, and the TFT 101 may have any of various structures. Further, the storage electrode line 128 may be formed simultaneously with the gate electrode 124 on the same layer and with the same material as that of the gate electrode 124.

Figure 6:
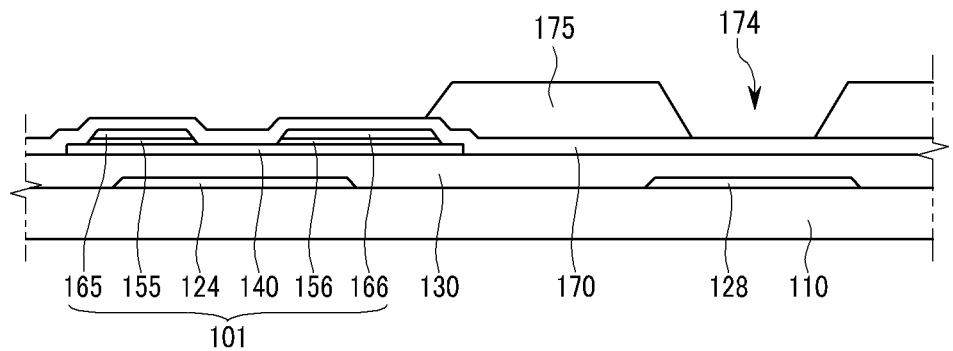

Next, as shown in FIG. 6, the color filter 175 is formed on the passivation layer 170. The color filter 175 has an opening 174 corresponding to the storage electrode line 128.

Figure 7:
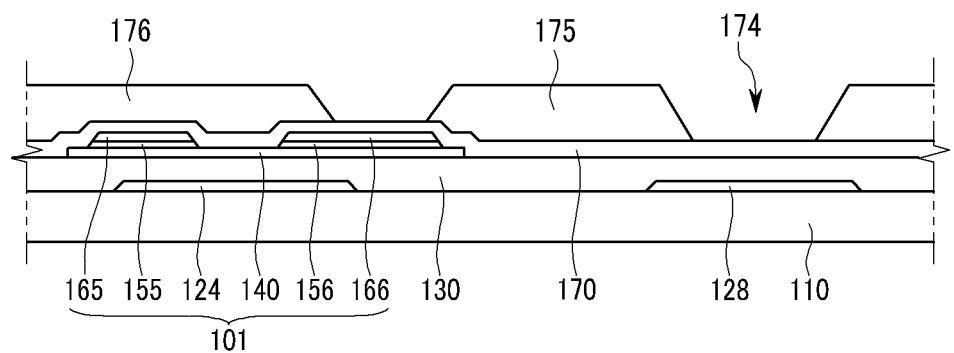

As shown in FIG. 7, the TFT 101 is covered by forming the light blocking member 176.

Figure 8:
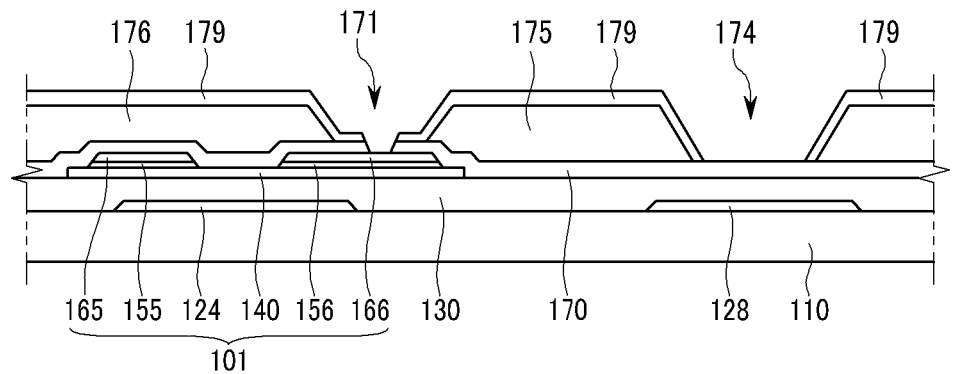

As shown in FIG. 8, after the capping layer 179 that covers the color filter 175 and the light blocking member 176 is formed, a contact hole 171 that exposes the drain electrode 166 of the TFT 101 is formed through a photolithography process.

Figure 9:
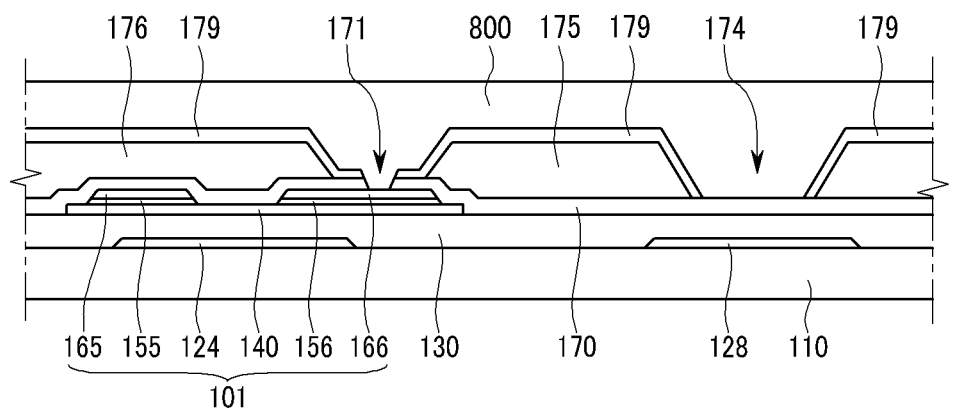

Next, as shown in FIG. 9, a conductive polymer layer 800 is coated on the capping layer 179. The conductive polymer layer 800 is made by mixing conductive particles with an insulating or semiconducting polymer or by chemically processing an insulating or semiconducting polymer. Specifically, for example, the conductive polymer layer may be made of a highly conductive polyethylene-dioxythiophene (PEDOT), or may be made by chemically processing at least one of polyacetylene, polyaniline, polypyrrole, polythiophene, poly(p-phenylene), poly(p-phenylene vinylene), poly(3,4-ethylenedioxythiophene) (PEDOT), or poly(thienylene vinylene).

Figure 10:
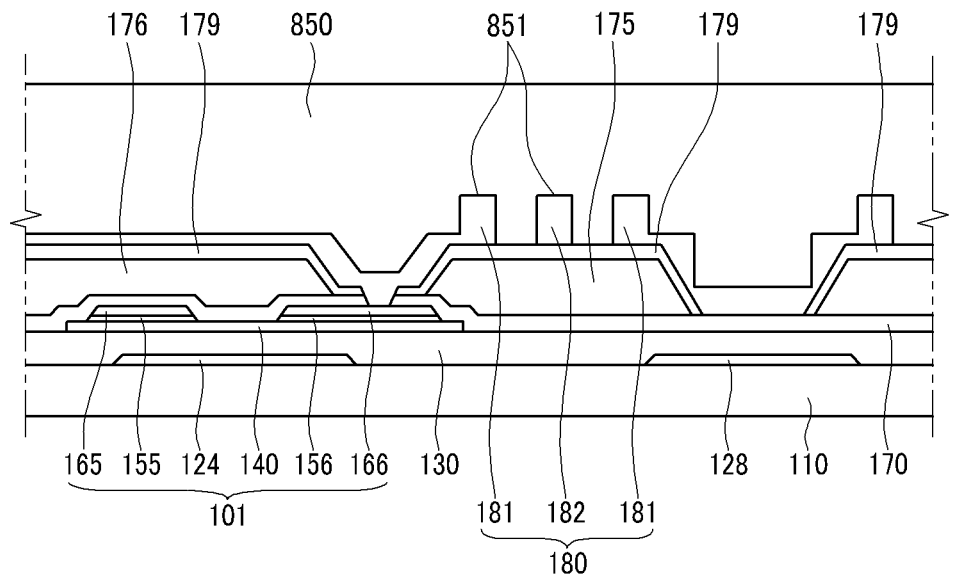

As shown in FIG. 10, the conductive polymer layer 800 is then imprinted using a mold 850 in which a depression pattern 851 is formed. The depression pattern 851 has a shape corresponding to the protrusion electrode pattern 180 to form with the conductive polymer layer 800. Therefore, when the mold 850 is removed after imprinting, the protrusion electrode pattern 180 is formed.

The protrusion electrode pattern 180 includes a first protrusion electrode 181 and a second protrusion electrode 182. The first protrusion electrode 181 and the second protrusion electrode 182 are connected to the first TFT 101 and the second TFT 102 through the contact holes 171 and 172, respectively.

Each of the first protrusion electrode 181 and the second protrusion electrode 182 may have a width in the range of 1 μm to 10 μm, and the first protrusion electrode 181 and the second protrusion electrode 182 may be disposed at a distance in the range of 1 μm to 10 μm therebetween. Further, the protrusion electrode pattern 180 may have a height in the range of 1 μm to 6 μm.

In addition, although not shown, an etching process that removes the remaining layer after imprinting may be further included. By removing the remaining layer through the etching process, the first protrusion electrode 181 and the second protrusion electrode 182 may be prevented from being connected by the remaining layer, and the conductive polymer layer 800 remaining in an unnecessary portion is removed.

By such a manufacturing method, a protrusion electrode pattern, which may be made of a conductive polymer material, may be easily and accurately formed.

According to exemplary embodiments of the present invention, as the display device has a protrusion electrode that has a simple structure and is accurately formed, the driving voltage may be stably decreased.

Further, a method of manufacturing a display device in which a protrusion electrode may easily be formed may be provided.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a display device, comprising:
   forming a thin film transistor (TFT) comprising a first TFT and a second TFT on a substrate;
   coating a conductive polymer layer on the substrate and the TFT; and
   forming a protrusion electrode pattern comprising a first protrusion electrode connected to the first TFT and a second protrusion electrode connected to the second TFT and spaced apart from the first protrusion electrode by imprinting the conductive polymer layer,
   wherein the first protrusion electrode and the second protrusion electrode have slit patterns that are alternately engaged with each other, and
   the width of each of the first protrusion electrode and the second protrusion electrode is greater than or equal to a distance between the first protrusion electrode and the second protrusion electrode.

2. The method of claim 1, wherein a mold in which a depression pattern corresponding to the protrusion electrode pattern is formed is used to imprint the conductive polymer layer.

3. The method of claim 1, wherein forming the protrusion electrode pattern further comprises an etching process that removes a portion of the conductive polymer layer that is not part of the protrusion electrode pattern after imprinting.

4. The method of claim 1, further comprising mixing a conductive particle with either an insulating polymer or a semiconducting polymer to form the conductive polymer layer.

5. The method of claim 1, wherein the conductive polymer layer comprises either a chemically processed insulating polymer or a chemically processed semiconducting polymer.

6. The method of claim 1, wherein:
   each of the first protrusion electrode and the second protrusion electrode has a width in the range of 1 μm to 10 μm; and
   the first protrusion electrode and the second protrusion electrode are disposed at a distance in the range of 1 μm to 10 μm from each other.

7. The method of claim 1, wherein the protrusion electrode pattern has a height in the range of 1 μm to 6 μm.

8. The method of claim 1, further comprising forming a color filter between the substrate and the protrusion electrode pattern.

* * * * *